(12) United States Patent
Johnson

(10) Patent No.: US 12,652,025 B2
(45) Date of Patent: Jun. 9, 2026

(54) CASCADING OF BUCKET BRIGADE DELAY DEVICES

(71) Applicant: SOUND SEMICONDUCTOR, INC., Arroyo Grande, CA (US)

(72) Inventor: Neil Edward Johnson, Cambridge (GB)

(73) Assignee: SOUND SEMICONDUCTOR, INC., Arroyo Grande, CA (US)

( * ) Notice: Subject to any disclaimer, the term of this patent is extended or adjusted under 35 U.S.C. 154(b) by 82 days.

(21) Appl. No.: 18/958,615

(22) Filed: Nov. 25, 2024

(65) Prior Publication Data

US 2026/0149431 A1 May 28, 2026

(51) Int. Cl.
H03H 11/26 (2006.01)
H03H 15/02 (2006.01)

(52) U.S. Cl.
CPC ............ H03H 11/26 (2013.01); H03H 15/02 (2013.01)

(58) Field of Classification Search
CPC .... H02M 3/1582; H02M 3/158; H02M 3/156; H02M 3/155; H02M 3/145; H02M 3/10; H02M 3/04; H02M 3/06
See application file for complete search history.

(56) References Cited

U.S. PATENT DOCUMENTS 3,740,591 A * 6/1973 Butler .................... H03H 15/02
333/165
3,983,408 A * 9/1976 Adam .................. G11C 19/186
327/317

* cited by examiner

*Primary Examiner* — Diana J. Cheng
(74) *Attorney, Agent, or Firm* — O'BANION & RITCHEY LLP; John P. O'Banion

(57) ABSTRACT

Enhanced Bucket Brigade Delay (BBD) circuits which more readily support cascaded configurations. A gain control mechanism is utilized in combination with an attenuation coupling network between subsequent BBD stages to achieve significantly longer delays than are achievable by the single BBD device, without introducing excessive noise or increased power dissipation associated with the need of reconstructing and biasing the intermediate signal between BBD devices.

20 Claims, 5 Drawing Sheets

CASCADING OF BUCKET BRIGADE DELAY DEVICES

CROSS-REFERENCE TO RELATED APPLICATIONS

Not Applicable

STATEMENT REGARDING FEDERALLY SPONSORED RESEARCH OR DEVELOPMENT

Not Applicable

NOTICE OF MATERIAL SUBJECT TO COPYRIGHT PROTECTION

A portion of the material in this patent document may be subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

BACKGROUND

1. Technical Field

The technology of this disclosure pertains generally to Bucket Brigade Delay (BBD) devices, and more particularly to cascading BBD devices with minimal components while limiting noise and distortion.

2. Background Discussion

Conventional cascades of Bucket Brigade Delay (BBD) devices require the use of filtering, reconstruction, and biasing that are costly and introduce noise and distortion along the BBD chain.

Accordingly, a need exists for enhanced BBD chaining apparatus and methods which simplify the cascading of BBD circuits while limiting the introduction of noise and distortion. The present disclosure fulfills that need and provides additional benefits over existing systems.

BRIEF SUMMARY

Bucket Brigade Delay (BBD) circuits have long been utilized in the audio technology space for creating short to medium length analog signal delays. However, in order to extend these delay times even further by cascading (chaining) together BBD circuits, significant circuitry is required between each stage toward reaching these longer delay times. Inclusion of this additional circuitry introduces signal noise, as well as increasing cost and power consumption, and thermal variabilities.

The present disclosure provides an apparatus, system and/or method of cascading multiple BBD circuits while only needing to incorporate a few circuit elements. In particular, a selectable gain stage is added to the BBD which does not require adding an external amplifier. This selectable gain stage is configured for interoperating with an attenuation coupling network; the two elements work together toward matching the subsequent BBD stages, and eliminating the need of reconstructing and biasing the intermediate signal between BBD devices, while still extending the analog discrete-time delay.

Further aspects of the technology described herein will be brought out in the following portions of the specification, wherein the detailed description is for the purpose of fully disclosing preferred embodiments of the technology without placing limitations thereon.

BRIEF DESCRIPTION OF THE DRAWINGS

The technology described herein will be more fully understood by reference to the following drawings which are for illustrative purposes only.

DETAILED DESCRIPTION

1. Introduction

1.1. BBD Circuit

In the field of audio signal processing, a Bucket Brigade Delay (BBD) is a discrete-time analog delay line, typically fabricated as a single integrated circuit (IC) device, which uses a long chain of capacitors and electronic switches to delay an analog signal.

Figures 1, 2, 3:
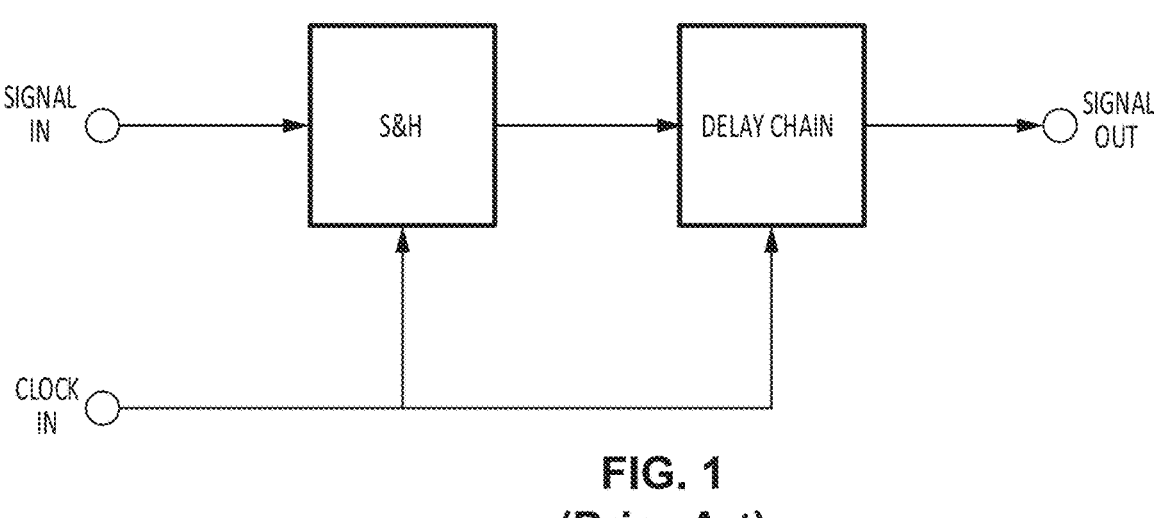
FIG. 1 is a block diagram of a Bucket Brigade Delay (BBD) circuit with inputs to a Sample and Hold (S&H) circuit connecting to a delay chain from which an output signal is generated after the delay of the delay chain.
FIG. 2 is a block diagram of a Bucket Brigade Delay (BBD) circuit connected for typical operation with its associated anti-aliasing filter, biasing circuit, reconstruction filter and DC blocking filter.
FIG. 3 is a block diagram of conventional coupling between two sequential Bucket Brigade Delay (BBD) circuits, shown with the associated reconstruction filter, DC blocking filter, and biasing circuit.

FIG. 1 depicts a BBD circuit showing signal and clock inputs to a Sample and Hold circuit (S&H) whose output along with the clock input are connected to a delay chain from which an output signal is generated after the delay of the delay chain. The delay chain typically comprises a series of electronic switches (e.g., MOSFETs) with capacitors interspersed between each series pair of switches.

Before entering this delay chain the analog signal is sampled, typically using a sample-and-hold (S&H) circuit, to convert the signal into a discrete packet of charge for passing along the delay chain.

1.2. Single BBD Circuit

FIG. 2 depicts the conventional circuitry for connecting a single BBD device. The input signal is shown being passed through an anti-aliasing filter and a biasing circuit to the BBD, which is then followed with a reconstruction filter and DC blocking filter before reaching the signal output. It should be noted that the clock and other control signals are not shown for the sake of simplicity of illustration.

More specifically, the input to the BBD requires an anti-aliasing filter to remove any high-frequency signals which would otherwise introduce distortion, and a bias circuit to apply a fixed DC bias to the input signal to support correct operation of the BBD device. Similarly, as the output of the BBD device comprises a sequence of sample pulses, these require filtering to remove clock artifacts in the process of reconstructing the audio signal, and a DC blocking circuit to remove the DC offset present on the output signal.

Existing BBD devices typically have fixed gains aiming for attaining an overall unity gain, such that the delayed signal amplitude on the output is the same as the original input signal amplitude. Accordingly, these circuits typically provide a small amount of fixed internal gain to compensate for the very small internal losses of charge in the BBD which arise as a result of component imperfections and charge leakage.

For simple applications, requiring just a single BBD device this is a sufficient design. For example, a single BBD device is often sufficient for creating audio effects that only require a short delay, for example flanging or chorus. However, for longer delays, such as echo and reverb, several BBD devices must be cascaded in series to achieve the required delay time which may be on the order of one second or more.

1.3. Conventional BBD Cascades

When cascading multiple BBD devices, the output signal from one BBD device requires the same signal filtering, reconstruction and biasing as needed both for the output and the following input.

FIG. 3 depicts the circuitry required between each pair of BBD devices in the chain of BBD devices. Specifically, the figure depicts insertion of a reconstruction filter, DC blocking filter, and biasing circuit, between BBDs. It should be appreciated that these circuits are in addition to the input and output circuitry seen in FIG. 2.

Accordingly, cascading multiple BBD circuits requires numerous components including active stages (e.g., amplifiers), which are both costly and introduce noise and distortion.

2. Present Disclosure

2.1. Purpose

The invention described herein solves the problem of cascading two or more BBD devices with a minimal number of external components, toward achieving low cost cascaded BBD circuitry subject to low levels of noise and distortion.

2.2. Embodiments of the Present Disclosure

An example embodiment is presented having two principle parts: a BBD with selectable gain stage(s) within each associated BBD, which interoperates with an attenuation coupling network (e.g., resistive).

The present disclosure can be realized in a number of variations within various packaging, such as within Integrated Circuits (ICs). For example, ICs can be implemented with any desired mixture of BBD with selectable gain stages and for example in some cases including the attenuation coupling network; such as for example by replacing the resistors with active devices, such as equivalent transistors (e.g., manipulating the junctions of NMOS transistors to form resistors, using transistors in their linear modes, or using them in a high speed switching mode to accumulate charge in simulating resistive actions, all of which are known in the art).

In at least one embodiment, the attenuation coupling network can be implemented with simple passive external components. In at least one embodiment, the attenuation coupling network is fabricated with active devices in the IC, but with pinouts to allow these to be bypassed, such as for accessing an external attenuation coupling network, providing the practitioner with options regarding the parameters of the attenuation coupling network.

Typically, in fabricating a BBD device, it would be expected that numerous gain controllable BBDs are implemented on the IC, and optionally including the associated attenuation coupling networks. Alternatively, an integrated circuit may comprise a given length of gain controlled cascaded BBDs already coupled together with the attenuation coupling networks, and preferably providing pinouts to allow accessing the signal between one or more of the cascaded BBDs, and/or using pinouts for interconnecting BBDs and/or their associated attenuation coupling networks.

2.2.1. BBD Attenuation Coupling Network

Figure 4:
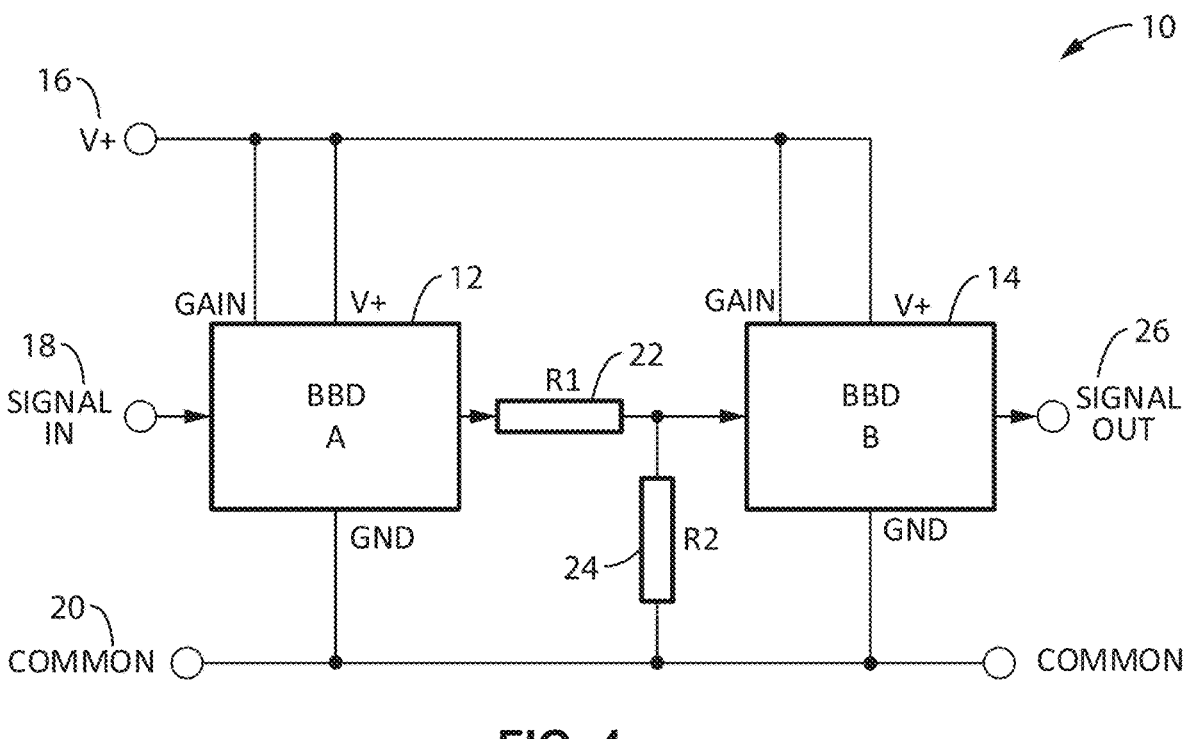
FIG. 4 is a block diagram of interconnected Gain Enabled Bucket Brigade Delay (GEBBD) devices, according to at least one embodiment of the present disclosure.

FIG. 4 illustrates an example embodiment 10 of an attenuation coupling network (e.g., resistive attenuation network) which interconnects two BBD sections. The attenuation coupling network utilized is a less than unity gain interface which matches the output offset of one gain enabled BBD device to the input bias requirement of the next BBD device.

Specifically, the circuit shows BBD device 12 interconnected to BBD device 14 through the attenuation coupling network, exemplified in this example as composing resistors 22, 24. Each BBD circuit is shown receiving power through V+ 16 and common (Gnd) 20. The input signal 18 is received by BBD12, with delayed signal output from BBD 12 through the resistor circuit to BBD14, which in turn outputs signal 26. In this example, the gain enable line from the BBD is shown tied to V+ as will be described in regard to FIG. 5.

Since all BBD devices coupled in the sequence are driven by the same clock, or clocks, (not shown in this figure), then the attenuation coupling network may in at least one embodiment comprise a simple two-resistor network, as the output and the following input are synchronized. And because they are synchronous to each other there is no need to reconstruct the analog signal, nor to require an anti-aliasing filter, as the sampling point of the BBD 14 coincides with the output of BBD 12.

The output of the BBD device 12 is fed into the first terminal of the attenuation coupling network, seen as upper resistor R1 22, which connects to the input of BBD 14 as well as to resistor R2 24 of the attenuation coupling network which is connected to common 20. The two resistors shift the output offset of the BBD device 12 down to the required input bias of the BBD device 14. In at least one embodiment the required ratio of the two resistors is 3:4, giving a reduction of 4/7ths (about 0.571); although differing ratios may be provided according to the characteristics of the specific delay circuits used and the application, insofar as the attenuation coupling network is configured to properly compensate for the increased gain provided by the gain enable circuit. Again, it should be emphasized that the attenuation coupling circuit may be implemented with active devices, and other approaches as described in a previous section to interoperate with the gain control of the sample and hold circuit.

Figure 5:
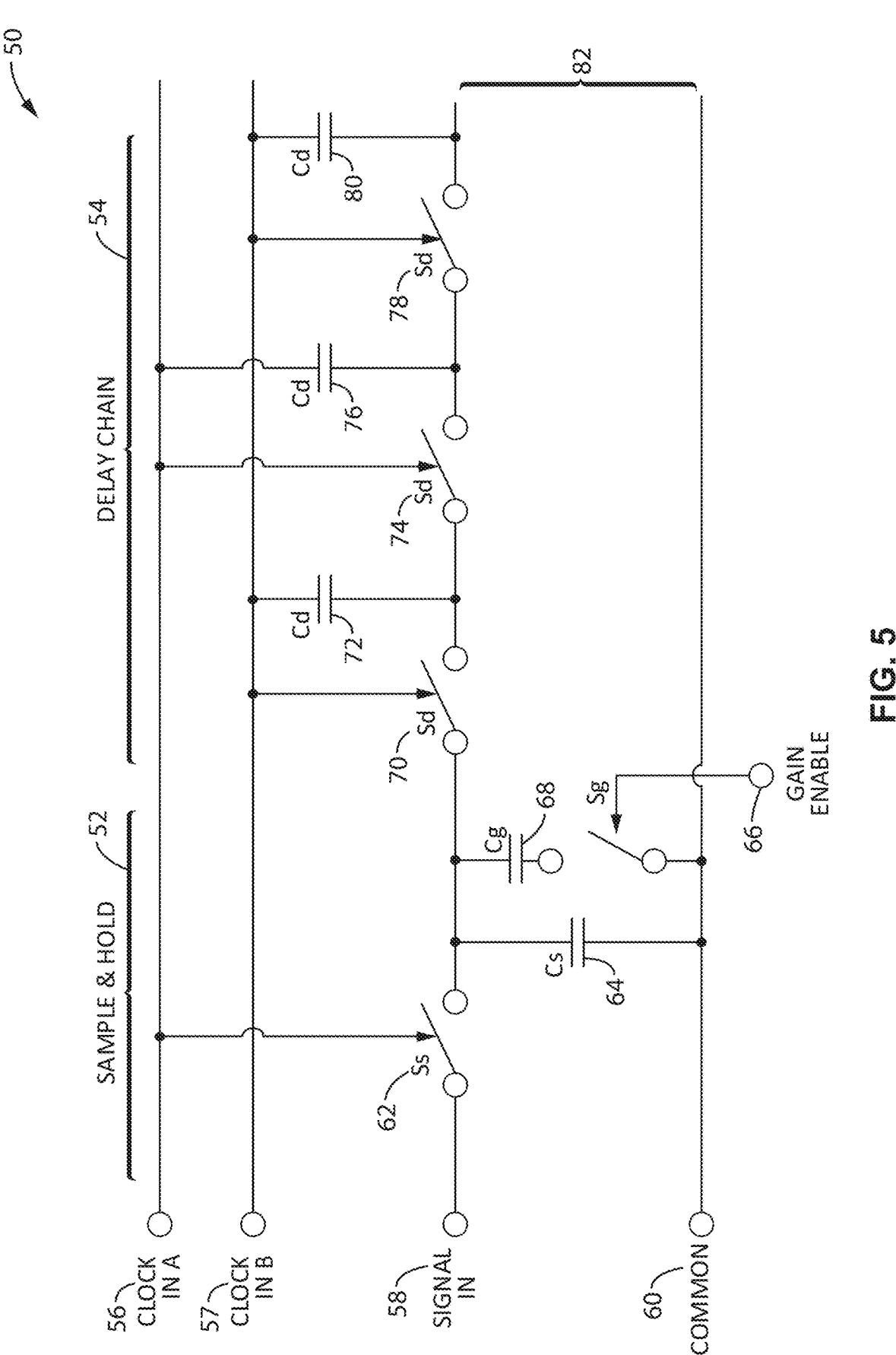
FIG. 5 is a block schematic of a sample and hold circuit and delay chain of a GEBBD, which includes a gain enabling circuit, according to at least one embodiment of the present disclosure.

FIG. 5 illustrates an example embodiment 50 of a selectable gain stage within a Gain Enabled BBD (GEBBD) device. This gain stage provides additional gain to the signal retained in the sample-and-hold circuit to compensate for the external resistive network described above. The gain of a BBD device is determined by the ratio of the capacitor in the sample-and-hold circuit, and the capacitors in the delay chain:

$$Gain = \frac{Cs}{Cd}$$

Where $C_s$ is the sample-and-hold capacitor and $C_d$ is the delay element capacitors which all have the same capacitance value. By making $C_s$ larger than $C_d$ then a fixed amount of gain is provided by using the additional capacitance.

The circuit is shown having a sample and hold section 52, followed by a delay chain section 54. Inputs are shown as Clock In A 56, Clock In B 57, Signal In 58 and Common 60. It will be noted that V+ is not shown in this figure for the sake simplicity of illustration. It should also be appreciated that the present disclosure contemplates the use of any of a variety of sample/hold and delay chain circuitry, which may be driven by any desired number of clocks, without departing from the teachings of the present disclosure.

The sample and hold circuit is exemplified with a series switch 62 coupled to a parallel (connected between the signal and common) capacitance $C_S$ 64. The extra selectable capacitance, $C_g$ 68, is placed in parallel within the unity-gain sampling capacitor 64. A simple electronic switch $S_g$ 67 in series with capacitor 68 enables the extra gain when the BBD device is to be used in a long cascade of BBD devices and disables the gain when the BBD device is to be used on its own. In at least one embodiment the gain is enabled when the gain enable signal is pulled to a first state (e.g., high, such as connected to V+), and disabled when pulled to a second state (e.g., low such as connected to common). It should also be appreciated that in at least one embodiment the BBD can be configured with additional gain capacitors and associated switches if in a specific application there is a benefit of having an ability to select a range of gains.

The first part of the delay chain is then shown with series switches Sd 70, 74, 78, between which are the parallel capacitors 72, 76 and 80, in a standard charged-capacitor bucket model having output 82. It should be noted that the delay chain may comprise any practical number of delay stages without departing from the present teachings.

It should also be appreciated that the instant disclosure can be applied to BBD devices which utilize a different form of sample and hold, or a more complex bucket brigade charge passing model, and/or different forms of clocking (e.g., multiple clocks) without departing from the teachings of the present disclosure, insofar as additional charge bucket 'depth' can be selectably enabled to increase charge retention on one stage of the device, and thus to control gain through the BBD device, which cooperates with the less than unity gain interface between BBD stages as described herein.

Figure 6:
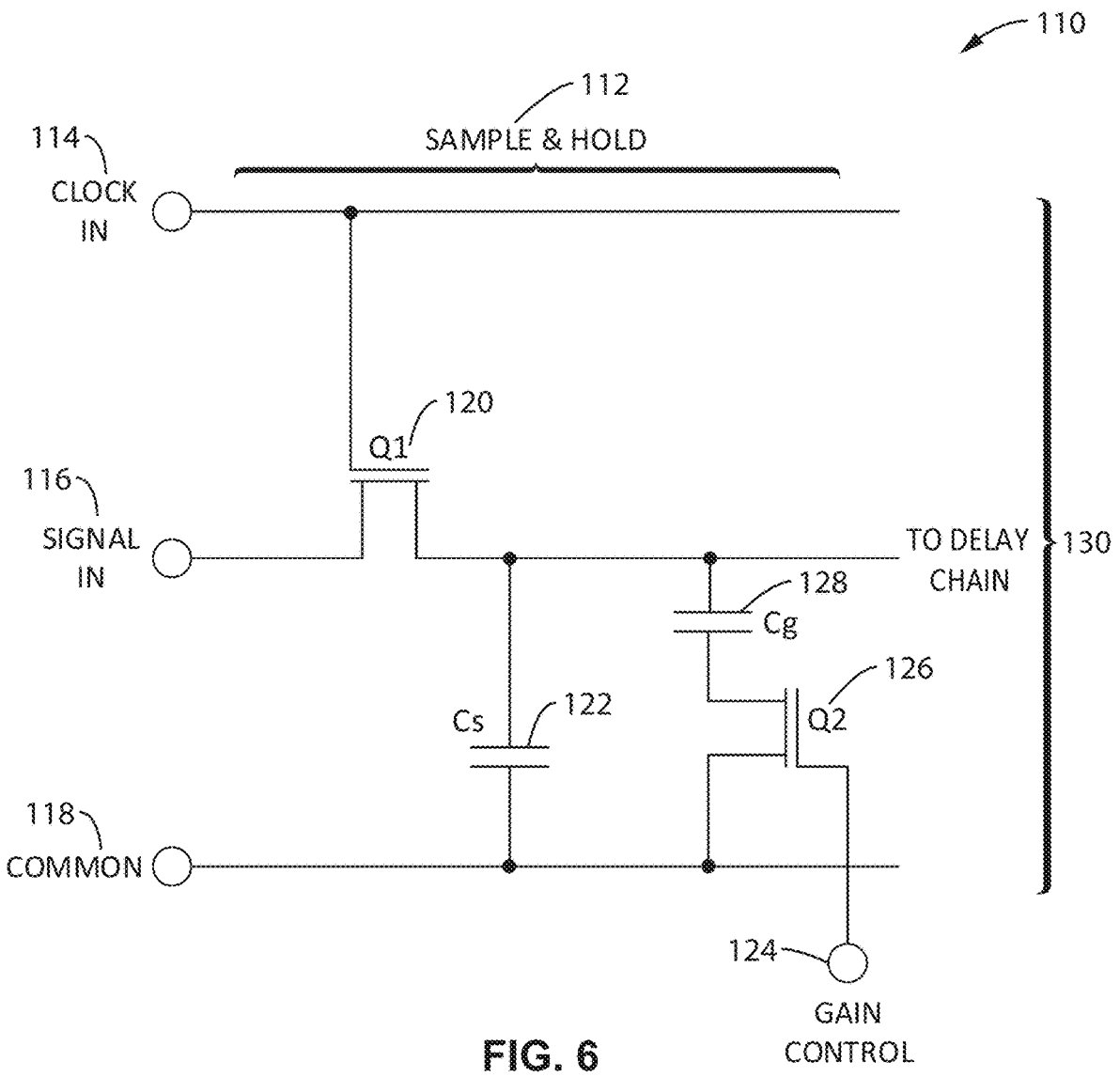
FIG. 6 is a block schematic of a sample and hold circuit of a GEBBD device fabricated using transistor switches and a transistor based gain enabling circuit, according to at least one embodiment of the present disclosure.

FIG. 6 illustrates an example embodiment 110 is shown of the sample and hold section 112 of the BBD using transistors as the switching elements. Although this example depicts the use of N-type Metal Oxide Semiconductor (NMOS) transistors, PMOS transistors and other types of transistors may be utilized (with appropriate transistor drive reversal and/or modification as would be known to one of ordinary skill in the art) without departing from the teachings of the present disclosure.

Lines are shown connecting to CLOCK In 114, SIGNAL IN 116, and Common 118. In this figure transistor Q1 120 is the sampling switch and the capacitor $C_S$ 122 is the sampling capacitor, such that when the CLOCK IN pin is held high then NMOS transistor Q1 120 is turned on and sets $C_s$ 122 to the same voltage as SIGNAL IN; and when the CLOCK IN pin is held low then NMOS transistor Q1 120 is turned off and the last voltage at SIGNAL IN is stored on capacitor $C_s$.

The additional gain control is implemented with capacitance $C_g$ 128 in combination with transistor Q2 126. When the GAIN CONTROL pin 124 is held low the NMOS transistor Q2 126 is turned off, and the gain capacitor $C_g$ is disconnected from the sample-and-hold circuit; whereby the gain of the BBD device is unity (or other desired fixed gain point, typically near unity) and is used for creating single BBD device circuits.

When the GAIN CONTROL pin 124 is held in an active state, for example connected to the V+ pin as was shown in FIG. 4, then NMOS transistor Q2 126 is turned on and the additional gain capacitor $C_g$ is now placed in parallel with the sample-and-hold capacitor $C_s$ 122. Activating the gain control circuit thus increases the total sample-and-hold capacitance, and due to the higher level of stored charge, gain is increased sufficiently to compensate for the loss due to the attenuation coupling network. In this state the increased gain is determined by:

$$Gain = \frac{Cs + Cg}{Cd},$$

It is also possible to use the additional gain of a GEBBD on a single BBD device circuit to afford the designer the benefits of a low noise signal amplification, since the gain is solely due to the ratio of the sampling capacitor and the delay capacitors. There are many possible applications for the present disclosure as should be recognized by a skilled practitioner.

2.3. Interoperative of GEBBD and Attenuation Coupling Network

The attenuation coupling network is used interoperably with the selective gain stage to support cascading BBDs. Working together these two parts of the invention give rise to a constant signal gain and a significantly simplified coupling network which resolves the issues of the original problem of cascading BBD circuits. It is very important to recognize that when cascading BBD devices having an activated gain control, that the attenuation coupling network, such as shown in FIG. 4 should be used, otherwise the resulting output could be at improper levels or distorted. When used as shown, the cascading of BBDs using the additional gain compensates for the potential divider effect of attenuation coupling network.

In at least one embodiment, the attenuation coupling network can provide the practitioner with access to one or more intermediate signals for further processing, such as feedback for reverb or similar effects.

Figures 7, 8:
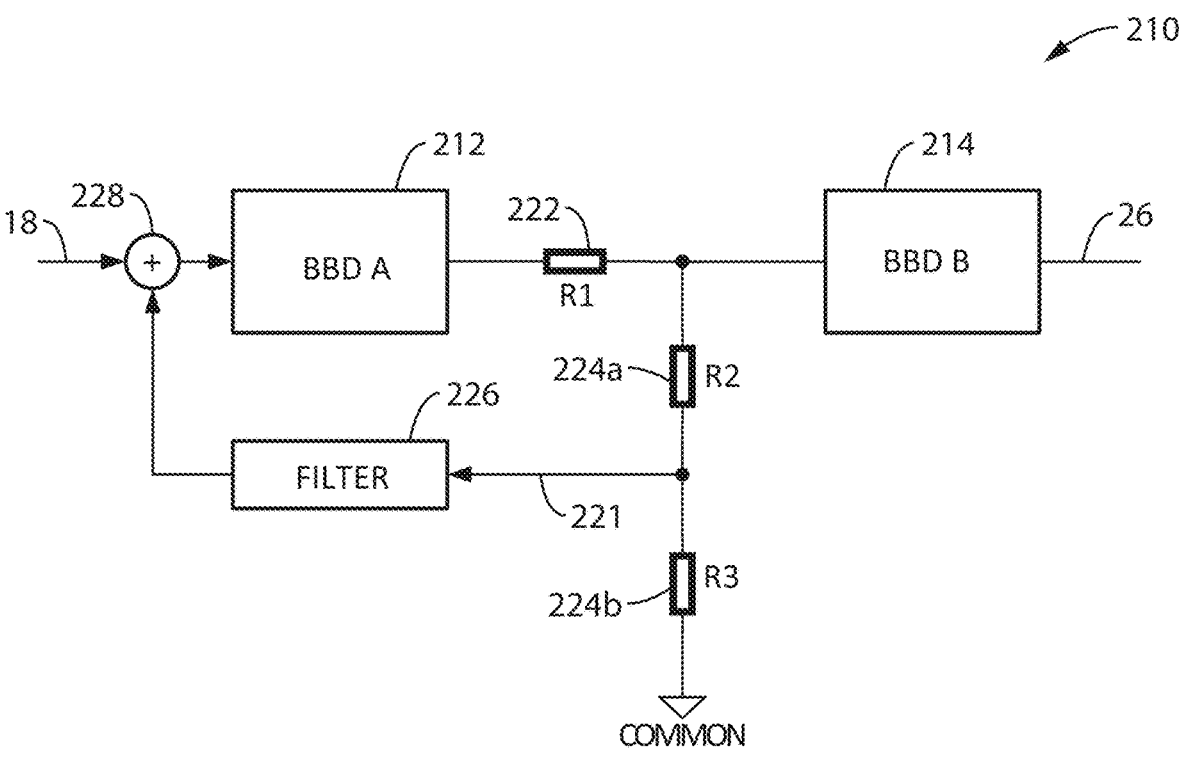
FIG. 7 is a schematic of intermediate signal access exemplified for further filtering, according to at least one embodiment of the present disclosure.
FIG. 8 is a schematic of BBDs coupled together in a manner to change frequency response, according to at least one embodiment of the present disclosure.

FIG. 7 illustrates an example of intermediate signal access 210. In this example a fraction of the signal in the attenuation coupling network is accessed for further filtering allowing the device to simulate acoustic reflections. Specifically, input is shown 18 to a summing junction 228 whose output reaches the first BBD (A) 212, having an output to the attenuation coupling network. In this example, this coupling network provides an additional output 221 that may be utilized in different ways by the practitioner. By way of example and not limitation, this extra output 221 is shown being directed through a signal conversion circuit 226, exemplified here as filtering, prior to reaching the summing junction preceding BBD 212.

Overall, the above circuit depicts the attenuation coupling network as being resistive, with a series resistor 222 connecting between BBDs 212 and 214 to reach output 26. Output side of resistor 222 is connected through a resistive ladder of R2 224a in series with R3 224b to ground. Additional output 221 is taken from between R2 and R3. It should be appreciated again that the attenuation coupling network may comprise active devices, such as transistors, and may be configured in any desired attenuation topology, without departing from the teachings of the present disclosure.

FIG. 8 illustrates an example embodiment 310 providing a further variation to modify the frequency response of the attenuation coupling network. The figure depicts input 18 to first BBD 312, whose output goes through the attenuation coupling network to BBD 314, having output 26.

The frequency response of the attenuation network is changed, by way of example and not limitation, by adding capacitance (and/or inductance) into the network. This is exemplified with a capacitor C1 322b shown coupled in parallel with R1 322a to enhance high audio frequencies, or capacitor C2 324b shown coupled across R2 324a to attenuate high audio frequencies. It should be appreciated that variations of this circuit can be created by one of ordinary skill in the art to address specific application types, or in combination with providing one or more intermediate signals shown in FIG. 7; towards further shaping the audio response as required in a way that would be recognized by one of ordinary skill in the art.

In terms of device temperature stability, since the gain of the BBD device is determined by the ratio of two capacitors, when the device changes temperature the two capacitors will change by equal proportions, and thus the gain does not change, resulting in very stable operation. If the attenuation coupling network, such as use of resistors, are similarly chosen to be low temperature coefficient types then the overall signal path gain is held constant over a wide operating temperature range.

2.4. BBD Clock Signal

As was shown in FIG. 5, Clock In A 56 and Clock In B 57, provide two clock signals which are normally driven, such that when Clock In A 56 is high then Clock In B 57 is low and vice versa. The action of the alternating opening and closing of the switches 70, 74 and 78 under the control of Clock In A 56 and Clock In B 57 is to shift the signal charge along the delay chain following well known principles that are not the subject of this invention, and will be well known to practitioners in the art.

3. General Scope of Embodiments

Embodiments of the technology of this disclosure may be described herein with reference to flowchart illustrations of methods and systems according to embodiments of the technology. Embodiments of the technology of this disclosure may also be described with reference to procedures, algorithms, steps, operations, formulae, or other computational depictions, which may be included within the flowchart illustrations or otherwise described herein. It will be appreciated that any of the foregoing may also be implemented as computer program instructions. In this regard, each block or step of a flowchart, and combinations of blocks (and/or steps) in a flowchart, as well as any procedure, algorithm, step, operation, formula, or computational depiction can be implemented by various means, such as hardware, firmware, and/or software including one or more computer program instructions embodied in computer-readable program code. As will be appreciated, any such computer program instructions may be executed by one or more computer processors, including without limitation a general purpose computer or special purpose computer, or other programmable processing apparatus to produce a machine, such that the computer program instructions which execute on the computer processor(s) or other programmable processing apparatus create means for implementing the function(s) specified.

Accordingly, blocks of the flowcharts, and procedures, algorithms, steps, operations, formulae, or computational depictions described herein support combinations of means for performing the specified function(s), combinations of steps for performing the specified function(s), and computer program instructions, such as embodied in computer-readable program code logic means, for performing the specified function(s). It will also be understood that each block of the flowchart illustrations, as well as any procedures, algorithms, steps, operations, formulae, or computational depictions and combinations thereof described herein, can be implemented by special purpose hardware-based computer systems which perform the specified function(s) or step(s), or combinations of special purpose hardware and computer-readable program code.

Furthermore, these computer program instructions, such as embodied in computer-readable program code, may also be stored in one or more computer-readable memory or memory devices that can direct a computer processor or other programmable processing apparatus to function in a particular manner, such that the instructions stored in the computer-readable memory or memory devices produce an article of manufacture including instruction means which implement the function specified in the block(s) of the flowchart(s). The computer program instructions may also be executed by a computer processor or other programmable processing apparatus to cause a series of operational steps to be performed on the computer processor or other programmable processing apparatus to produce a computer-implemented process such that the instructions which execute on the computer processor or other programmable processing apparatus provide steps for implementing the functions specified in the block(s) of the flowchart(s), procedure(s) algorithm(s), step(s), operation(s), formula (e), or computational depiction(s).

It will further be appreciated that the terms "programming" or "program executable" as used herein refer to one or more instructions that can be executed by one or more computer processors to perform one or more functions as described herein. The instructions can be embodied in software, in firmware, or in a combination of software and firmware. The instructions can be stored local to the device in non-transitory media, or can be stored remotely such as on a server, or all or a portion of the instructions can be stored locally and remotely. Instructions stored remotely can be downloaded (pushed) to the device by user initiation, or automatically based on one or more factors.

It will further be appreciated that as used herein, the terms controller, microcontroller, processor, microprocessor, hardware processor, computer processor, central processing unit (CPU), and computer are used synonymously to denote a device capable of executing the instructions and communicating with input/output interfaces and/or peripheral devices, and that the terms controller, microcontroller, processor, microprocessor, hardware processor, computer processor, CPU, and computer are intended to encompass single or multiple devices, single core and multicore devices, and variations thereof.

From the description herein, it will be appreciated that the present disclosure encompasses multiple implementations of the technology which include, but are not limited to, the following:

An apparatus for providing a discrete-time delay of an analog signal, comprising: (a) a sample and hold circuit configured for receiving an incoming analog signal which is sampled through a first switch to charge a charge-holding capacitance, after which the switch is opened and a voltage is retained on the charge-holding capacitance; (b) a gain control circuit which through a second switch connects an additional gain capacitance in parallel with the charge-holding capacitance, whereby a forward voltage gain is achieved; (c) a delay chain comprising bucket-brigade stages in which charge is passed through switches from one capacitive stage to another, thereby delaying the incoming analog signal before it is output from the delay chain; (d) wherein said sample and hold circuit, gain control circuit, and delay chain are part of a first bucket-brigade device (BBD); (e) an attenuation coupling network which matches the output offset of said first BBD to the input bias requirement of a subsequent BBD; and (f) wherein the gain control circuit in a BBD acts in cooperation with the attenuation coupling network to allow cascading sequential BBD devices without the need of reconstructing and biasing the intermediate signal between BBD devices, while providing an extended analog discrete-time delay.

An apparatus for providing a discrete-time delay of an analog signal, comprising: (a) a sample and hold circuit configured for receiving an incoming analog signal which is sampled through a first switch to charge a charge-holding capacitance, after which the switch is opened, and a voltage is retained on the charge-holding capacitance; (b) a gain control circuit which through a second switch connects an additional gain capacitance in parallel with the charge-holding capacitance, whereby a forward voltage gain is achieved; (c) a delay chain comprising bucket-brigade stages in which charge is passed through switches from one capacitive stage to another, thereby delaying the incoming analog signal before it is output from the delay chain; (d) wherein said sample and hold circuit, gain control circuit, and delay chain are part of a first bucket-brigade device (BBD) which is configured for connecting through an attenuation coupling network which matches the output offset of the forward voltage gain achieved by the gain control circuit of said first BBD to the input bias requirement of a subsequent BBD; (e) wherein the gain control circuit in a BBD acts in cooperation with the attenuation coupling network to allow cascading sequential BBD devices without the need of a reconstruction filter, or DC blocking, or biasing circuits between each sequential BBD, which in combination provide an extended analog discrete-time delay.

A system for providing a discrete-time delay of an analog signal, comprising: (a) a sample and hold circuit configured for receiving an incoming analog signal which is sampled through a first switch to charge a charge-holding capacitance, after which the switch is opened, and a voltage is retained on the charge-holding capacitance; (b) a gain control circuit which through a second switch connects an additional gain capacitance in parallel with the charge-holding capacitance, whereby a forward voltage gain is achieved; (c) a delay chain comprising bucket-brigade stages in which charge is passed through switches from one capacitive stage to another, thereby delaying the incoming analog signal before it is output from the delay chain; (d) wherein said sample and hold circuit, gain control circuit, and delay chain are part of a first bucket-brigade device (BBD); and (e) an attenuation coupling network which is connected to the output of said first BBD for matching the output offset of said first BBD to the input bias requirement of a subsequent BBD; (f) wherein the gain control circuit in a BBD acts in cooperation with the attenuation coupling network to allow cascading sequential BBD devices without the need of a reconstruction filter, or DC blocking, or biasing circuits between each sequential BBD, which in combination provide an extended analog discrete-time delay.

A method of providing a discrete-time delay in an analog signal, comprising: (a) sampling, at a first bucket-brigade device (BBD) delay stage, an incoming analog signal to store and hold a charge associated with the incoming analog signal, on a charge holding capacitance; (b) switching in additional capacitance to create a forward voltage gain in storing and holding the charge; (c) sequentially delaying passing of the charge between bucket-brigade stages of a delay chain in said first BBD delay stage, starting from said charge holding capacitance, in which charge is passed from one capacitive stage to another, incurring a delay of a representation of the incoming analog signal before it is output from the delay chain; and (d) inserting an attenuation coupling to the end of the delay chain which matches the output offset of the forward voltage gain of this first BBD delay stage, with the input bias requirement of a subsequent BBD delay stage to achieve an extended analog discrete-time delay.

The apparatus or system or method of any preceding implementation, wherein one or more of BBD and attenuation coupling networks are contained in a single integrated circuit.

The apparatus or system or method of any preceding implementation, wherein all capacitors of the sample and hold circuit, gain control circuit, and delay chain are fabricated on the same integrated circuit, whereby the gain is stable with respect to temperature.

The apparatus or system or method of any preceding implementation, wherein said gain control circuit introduces lower levels of signal noise than gain control circuits requiring amplifiers.

The apparatus or system or method of any preceding implementation, wherein said gain control circuit relies on the ratio of two capacitors and the charge-voltage relationship to generate the forward voltage gain, and thus can operate at lower power levels than gain circuitry requiring an amplifier.

The apparatus or system or method of any preceding implementation, wherein the gain from an active gain control circuit is matched to a corresponding attenuation coupling network between consecutive BBD devices.

The apparatus or system or method of any preceding implementation, wherein generation of the forward voltage gain interoperates with the attenuation coupling to allow cascading sequential delay stages without the need of a reconstruction filter, or DC blocking, or biasing circuits between each sequential BBD.

The apparatus or system or method of any preceding implementation, wherein said switching in additional capacitance to create a forward voltage gain in storing and holding the charge introduces lower levels of signal noise than gain control circuits requiring amplifiers.

The apparatus or system or method of any preceding implementation, wherein all capacitors of the sample and hold circuit, gain control circuit, and delay chain are fabricated on the same integrated circuit, whereby the gain is stable with respect to temperature.

As used herein, the term "implementation" is intended to include, without limitation, embodiments, examples, or other forms of practicing the technology described herein.

As used herein, the singular terms "a," "an," and "the" may include plural referents unless the context clearly dictates otherwise. Reference to an object in the singular is not intended to mean "one and only one" unless explicitly so stated, but rather "one or more."

Phrasing constructs, such as "A, B and/or C", within the present disclosure describe where either A, B, or C can be present, or any combination of items A, B and C. Phrasing constructs indicating, such as "at least one of" followed by listing a group of elements, indicates that at least one of these groups of elements is present, which includes any possible combination of the listed elements as applicable.

References in this disclosure referring to "an embodiment", "at least one embodiment" or similar embodiment wording indicates that a particular feature, structure, or characteristic described in connection with a described embodiment is included in at least one embodiment of the present disclosure. Thus, these various embodiment phrases are not necessarily all referring to the same embodiment, or to a specific embodiment which differs from all the other embodiments being described. The embodiment phrasing should be construed to mean that the particular features, structures, or characteristics of a given embodiment may be combined in any suitable manner in one or more embodiments of the disclosed apparatus, system, or method.

As used herein, the term "set" refers to a collection of one or more objects. Thus, for example, a set of objects can include a single object or multiple objects.

Relational terms such as first and second, top and bottom, upper and lower, left and right, and the like, may be used solely to distinguish one entity or action from another entity or action without necessarily requiring or implying any actual such relationship or order between such entities or actions.

The terms "comprises," "comprising," "has", "having," "includes", "including," "contains", "containing" or any other variation thereof, are intended to cover a non-exclusive inclusion, such that a process, method, article, apparatus, or system, that comprises, has, includes, or contains a list of elements does not include only those elements but may include other elements not expressly listed or inherent to such process, method, article, apparatus, or system. An element proceeded by "comprises . . . a", "has . . . a", "includes . . . a", "contains . . . a" does not, without more constraints, preclude the existence of additional identical elements in the process, method, article, apparatus, or system, that comprises, has, includes, contains the element.

As used herein, the terms "approximately", "approximate", "substantially", "substantial", "essentially", and "about", or any other version thereof, are used to describe and account for small variations. When used in conjunction with an event or circumstance, the terms can refer to instances in which the event or circumstance occurs precisely as well as instances in which the event or circumstance occurs to a close approximation. When used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" aligned can refer to a range of angular variation of less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values may sometimes be presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified. For example, a ratio in the range of about 1 to about 200 should be understood to include the explicitly recited limits of about 1 and about 200, but also to include individual ratios such as about 2, about 3, and about 4, and sub-ranges such as about 10 to about 50, about 20 to about 100, and so forth.

The term "coupled" as used herein is defined as connected, although not necessarily directly and not necessarily mechanically. A device or structure that is "configured" in a certain way is configured in at least that way, but may also be configured in ways that are not listed.

Benefits, advantages, solutions to problems, and any element(s) that may cause any benefit, advantage, or solution to occur or become more pronounced are not to be construed as a critical, required, or essential feature or element of the technology described herein or any or all the claims.

In addition, in the foregoing disclosure various features may be grouped together in various embodiments for the purpose of streamlining the disclosure. This method of disclosure is not to be interpreted as reflecting an intention that the claimed embodiments require more features than are expressly recited in each claim. Inventive subject matter can lie in less than all features of a single disclosed embodiment.

The abstract of the disclosure is provided to allow the reader to quickly ascertain the nature of the technical disclosure. It is submitted with the understanding that it will not be used to interpret or limit the scope or meaning of the claims.

It will be appreciated that the practice of some jurisdictions may require deletion of one or more portions of the disclosure after the application is filed. Accordingly, the reader should consult the application as filed for the original content of the disclosure. Any deletion of content of the disclosure should not be construed as a disclaimer, forfeiture, or dedication to the public of any subject matter of the application as originally filed.

All text in a drawing figure is hereby incorporated into the disclosure and is to be treated as part of the written description of the drawing figure.

The following claims are hereby incorporated into the disclosure, with each claim standing on its own as a separately claimed subject matter.

Although the description herein contains many details, these should not be construed as limiting the scope of the disclosure, but as merely providing illustrations of some of the presently preferred embodiments. Therefore, it will be appreciated that the scope of the disclosure fully encompasses other embodiments which may become obvious to those skilled in the art.

All structural and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

What is claimed is:

1. An apparatus for providing a discrete-time delay of an analog signal, comprising:
   a sample and hold circuit configured for receiving an incoming analog signal which is sampled through a first switch to charge a charge-holding capacitance, after which the switch is opened, and a voltage is retained on the charge-holding capacitance;
   a gain control circuit which through a second switch connects an additional gain capacitance in parallel with the charge-holding capacitance, whereby a forward voltage gain is achieved;
   a delay chain comprising bucket-brigade stages in which charge is passed through switches from one capacitive stage to another, thereby delaying the incoming analog signal before it is output from the delay chain;
   wherein said sample and hold circuit, gain control circuit, and delay chain are part of a first bucket-brigade device (BBD);
   an attenuation coupling network which matches the output offset of said first BBD to the input bias requirement of a subsequent BBD; and
   wherein the gain control circuit in a BBD acts in cooperation with the attenuation coupling network to allow cascading sequential BBD devices without the need of reconstructing and biasing the intermediate signal between BBD devices, while providing an extended analog discrete-time delay.

2. The apparatus of claim 1, wherein one or more of BBD and attenuation coupling networks are contained in a single integrated circuit.

3. The apparatus of claim 1, wherein all capacitors of the sample and hold circuit, gain control circuit, and delay chain are fabricated on the same integrated circuit, whereby the gain is stable with respect to temperature.

4. The apparatus of claim 1, wherein said gain control circuit introduces lower levels of signal noise than gain control circuits requiring amplifiers.

5. The apparatus of claim 1, wherein said gain control circuit relies on the ratio of two capacitors and the charge-voltage relationship to generate the forward voltage gain, and thus can operate at lower power levels than gain circuitry requiring an amplifier.

6. The apparatus of claim 1, wherein the gain from an active gain control circuit is matched to a corresponding attenuation coupling network between consecutive BBD devices.

7. An apparatus for providing a discrete-time delay of an analog signal, comprising:
   a sample and hold circuit configured for receiving an incoming analog signal which is sampled through a first switch to charge a charge-holding capacitance, after which the switch is opened, and a voltage is retained on the charge-holding capacitance;
   a gain control circuit which through a second switch connects an additional gain capacitance in parallel with the charge-holding capacitance, whereby a forward voltage gain is achieved;
   a delay chain comprising bucket-brigade stages in which charge is passed through switches from one capacitive stage to another, thereby delaying the incoming analog signal before it is output from the delay chain;
   wherein said sample and hold circuit, gain control circuit, and delay chain are part of a first bucket-brigade device (BBD) which is configured for connecting through an attenuation coupling network which matches the output offset of the forward voltage gain achieved by the gain control circuit of said first BBD to the input bias requirement of a subsequent BBD;
   wherein the gain control circuit in a BBD acts in cooperation with the attenuation coupling network to allow cascading sequential BBD devices without the need of a reconstruction filter, or DC blocking, or biasing circuits between each sequential BBD, which in combination provide an extended analog discrete-time delay.

8. The apparatus of claim 7, wherein said attenuation coupling network is a passive attenuation matching network which is electrically connected between sequential BBD devices.

9. The apparatus of claim 7, wherein all capacitors of the sample and hold circuit, gain control circuit, and delay chain are fabricated on the same integrated circuit, whereby the gain is stable with respect to temperature.

10. The apparatus of claim 7, wherein said gain control circuit introduces lower levels of signal noise than gain control circuits requiring amplifiers.

11. The apparatus of claim 7, wherein said gain control circuit relies on the ratio of two capacitors and the charge-voltage relationship to generate the forward voltage gain, and thus can operate at lower power levels than gain circuitry requiring an amplifier.

12. A system for providing a discrete-time delay of an analog signal, comprising:
   a sample and hold circuit configured for receiving an incoming analog signal which is sampled through a first switch to charge a charge-holding capacitance, after which the switch is opened, and a voltage is retained on the charge-holding capacitance;

a gain control circuit which through a second switch connects an additional gain capacitance in parallel with the charge-holding capacitance, whereby a forward voltage gain is achieved;

a delay chain comprising bucket-brigade stages in which charge is passed through switches from one capacitive stage to another, thereby delaying the incoming analog signal before it is output from the delay chain;

wherein said sample and hold circuit, gain control circuit, and delay chain are part of a first bucket-brigade device (BBD); and an attenuation coupling network which is connected to the output of said first BBD for matching the output offset of said first BBD to the input bias requirement of a subsequent BBD;

wherein the gain control circuit in a BBD acts in cooperation with the attenuation coupling network to allow cascading sequential BBD devices without the need of a reconstruction filter, or DC blocking, or biasing circuits between each sequential BBD, which in combination provide an extended analog discrete-time delay.

13. The apparatus of claim 12, wherein one or more said BBDs are on separate device packages which are configure for connection to one or more of said attenuation coupling networks.

14. The apparatus of claim 12, wherein all capacitors of the sample and hold circuit, gain control circuit, and delay chain are fabricated on the same integrated circuit, whereby the gain is stable with respect to temperature.

15. The apparatus of claim 12, wherein said gain control circuit introduces lower levels of signal noise than gain control circuits requiring amplifiers.

16. The apparatus of claim 12, wherein said gain control circuit relies on the ratio of two capacitors and the charge-voltage relationship to generate the forward voltage gain, and thus can operate at lower power levels than gain circuitry requiring an amplifier.

17. A method of providing a discrete-time delay in an analog signal, comprising:

sampling, at a first bucket-brigade device (BBD) delay stage, an incoming analog signal to store and hold a charge associated with the incoming analog signal, on a charge holding capacitance;

switching in additional capacitance to create a forward voltage gain in storing and holding the charge;

sequentially delaying passing of the charge between bucket-brigade stages of a delay chain in said first BBD delay stage, starting from said charge holding capacitance, in which charge is passed from one capacitive stage to another, incurring a delay of a representation of the incoming analog signal before it is output from the delay chain; and inserting an attenuation coupling to the end of the delay chain which matches the output offset of the forward voltage gain of this first BBD delay stage, with the input bias requirement of a subsequent BBD delay stage to achieve an extended analog discrete-time delay.

18. The method of claim 17, wherein generation of the forward voltage gain interoperates with the attenuation coupling to allow cascading sequential delay stages without the need of a reconstruction filter, or DC blocking, or biasing circuits between each sequential BBD.

19. The method of claim 17, wherein said switching in additional capacitance to create a forward voltage gain in storing and holding the charge introduces lower levels of signal noise than gain control circuits requiring amplifiers.

20. The method of claim 17, wherein all capacitors of the sample and hold circuit, gain control circuit, and delay chain are fabricated on the same integrated circuit, whereby the gain is stable with respect to temperature.

* * * * *